(12) United States Patent
Gerstmeier et al.

(10) Patent No.: US 6,656,647 B2
(45) Date of Patent: Dec. 2, 2003

(54) METHOD FOR EXAMINING STRUCTURES ON A WAFER

(75) Inventors: Guenther Gerstmeier, Chapel Hill, NC (US); Frank Richter, Dresden (DE); Valentin Rosskopf, Poettmes (DE)

(73) Assignee: Infineon Technologies AG, Munich (DE)

( * ) Notice: Subject to any disclaimer, the term of this patent is extended or adjusted under 35 U.S.C. 154(b) by 38 days.

(21) Appl. No.: 09/935,353

(22) Filed: Aug. 22, 2001

(65) Prior Publication Data

US 2002/0090747 A1 Jul. 11, 2002

(30) Foreign Application Priority Data

Aug. 22, 2000 (DE) .......................................... 100 43 350

(51) Int. Cl.⁷ ................................................. G03F 9/00
(52) U.S. Cl. .......................... 430/30; 382/145; 382/149
(58) Field of Search ........................... 430/30; 382/145, 382/149

(56) References Cited

U.S. PATENT DOCUMENTS 4,131,472 A * 12/1978 MacDonald, Jr. et al. .... 430/30

FOREIGN PATENT DOCUMENTS

| DE | 198 19 570 C2 | 6/2000 |
| EP | 0 430 372 B1 | 6/1991 |

* cited by examiner

Primary Examiner—Christopher G. Young
(74) Attorney, Agent, or Firm—Laurence A. Greenberg; Werner H. Stemer; Ralph E. Locher

(57) ABSTRACT

In a method for examining structures on a wafer, at least one mask, which is applied on the wafer and is fabricated by exposure processes, is used for fabricating the structures. Test circuits with test structures are placed on the mask in predetermined reference positions. In order to check the structures and/or the exposure processes, electrical parameters of the test circuits are detected and evaluated in a location-dependent manner.

12 Claims, 2 Drawing Sheets

METHOD FOR EXAMINING STRUCTURES ON A WAFER

BACKGROUND OF THE INVENTION

Field of the Invention

The invention relates to a method for examining structures on a wafer.

Wafers of this type are typically formed by silicon wafers and serve for fabricating integrated circuits and the like.

Integrated circuits of this type contain complex configurations of transistors, memory cells and the like which are contact-connected via interconnects which run in different planes.

In particular, photolithography processes are also used for fabricating structures of this type. In photolithography processes of this type, resist layers are applied to the wafer in predetermined planes. The resist layers are exposed in predetermined patterns by exposure systems, as a result of which these points on the resist layer are chemically altered. Afterward, the exposed or unexposed regions of the resist layer are removed. The resist patterns thus obtained form a mask for subsequent process steps, such as etching processes, for example.

What is problematic is that the exposure processes cannot be carried out with arbitrary accuracy. This results in so-called overlay errors, in other words displacements of different planes with respect to one another are produced when a plurality of successive exposure processes are carried out. Moreover, so-called registration errors are produced, which stem from the fact that a mask cannot be aligned with arbitrary accuracy relative to the wafer.

Errors of this type lead to an offset of structures between different planes. Furthermore, production and process-dictated fluctuations of the imaging can also occur during exposure processes within a plane. Fluctuations of this type are caused, in particular, by virtue of the fact that the imaging properties of the exposure system can vary over the respective image plane. Furthermore, such process-dictated fluctuations in structures within a plane can be caused by virtue of the fact that there are inhomogeneities in the resist layer. Finally, such structure fluctuations can be caused by inhomogeneities of the production processes, such as, for example, etching processes, sputtering processes, for which the above-mentioned masks are required.

Optical examination methods have proved successful in particular for examining overlay and registration errors. For this purpose, test patterns are disposed at predetermined positions of a plane and are examined by the exposure system. In this case, the test patterns can be formed by overlay targets, for example, which can be used to measure the offset between two planes. Furthermore, test patterns, which have minimal structures and may be configured in the form of periodic or isolated structures may be provided at predetermined positions. The structure sizes preferably correspond to the minimal structure size occurring in the respective process. The variation of the line widths over the individual test patterns during exposure by the exposure system enables statements to be made about the fluctuations of such structure patterns over the wafer surface.

Examination methods of this type have the disadvantage, however, that structure errors of circuit configurations, in particular including the location dependencies thereof, can only be detected incompletely by the methods.

SUMMARY OF THE INVENTION

It is accordingly an object of the invention to provide a method for examining structures on a wafer which overcomes the above-mentioned disadvantages of the prior art methods of this general type, in which it is ensured the most accurate and comprehensive examination possible of structures on a wafer occur.

With the foregoing and other objects in view there is provided, in accordance with the invention, a method for examining structures on a wafer. The method includes applying at least one mask on the wafer and the mask is fabricated by exposure processes and is used for fabricating the structures. Test circuits are formed on the mask in predetermined reference positions, and the test circuits are formed with test transistors having test structures including gate oxide regions, source/drain regions and deep trench regions. In a location-dependent manner, electrical parameters of the test circuits are detected and evaluated for evaluating the structures and the exposure processes.

According to the invention, test circuits with test structures are placed on at least one mask applied on a wafer in predetermined reference positions.

In order to check the structures and/or the exposure processes, electrical parameters of the test circuits are evaluated in a location-dependent manner.

The basic concept of the invention thus consists in using electrical parameters of test circuits for checking structures on the wafer and/or exposure processes.

A suitable configuration of the test circuits on the wafer surface enables, through a location-dependent evaluation of the electrical parameters of the test circuits, not only the determination of overlay and registration errors but also a detailed and accurate checking of fluctuations of imaging parameters of the exposure processes used and also of inhomogeneities during production processes. In particular, it is possible to detect production fluctuations of the production processes used during the processing of the wafer, such as, for example, etching processes or sputtering processes. Furthermore, it is also possible to detect inhomogeneities in the resist layer of the respective mask. The test circuits are particularly advantageously disposed in the scribe lines of the wafer, which extend in a chessboard-like manner over the wafer surfaces. In this case, the test circuits are preferably distributed as uniformly as possible over the entire wafer surface. In this way, it is possible to detect fluctuations of the exposure processes and production processes completely over the entire wafer surface.

In a particularly advantageous embodiment of the invention, the test circuits contain test transistors, which are embedded in transistor arrays as reference environments. In this case, the test transistors have minimal structure sizes with regard to the surrounding transistor arrays and preferably also with regard to the structures on the wafer.

Inhomogeneities of the structures of the test transistors, the inhomogeneities being caused by line width fluctuations of the exposure system and also by fluctuations of the individual production processes, can be detected by a location-dependent measurement of the electrical parameters of the test transistors, in particular the threshold voltages thereof.

The location-dependent evaluation of the electrical parameters makes it possible, in particular, to make accurate statements about the variation of the structures over the wafer surface and also to derive correction values for the electrical parameters of such structures. Such correction values are particularly advantageously used for dimensioning the parameters of the structures on the wafer. Such structures, in the same way as the test circuits, may be formed by transistors, for example. The correction values specify, for example, the range within which the parameters of the transistor may vary. Accordingly, the transistors are configured in such a way that they are insensitive to the parameter fluctuations that occur.

In accordance with an added mode of the invention, there is the step of detecting variations in lengths of the gate oxide regions by measuring the electrical parameters of the test transistors, the variations being caused by line width fluctuations in the exposure processes.

In accordance with an additional mode of the invention, there is the step of detecting an offset of the source/drain regions with respect to the gate oxide regions and the deep trench regions by measuring the electrical parameters of the test transistors.

In accordance with another mode of the invention, there is the step of evaluating threshold voltages of the test transistors as the electrical parameters.

In accordance with a further mode of the invention, there is the step of determining location-dependent fluctuations of electrical parameters of the structures to be examined by measuring the electrical parameters of the test circuits.

In accordance with a further added mode of the invention, there is the step of deriving correction values from the location-dependent fluctuations of the electrical parameters of the structures. The correction values are used for dimensioning the electrical parameters of the structures on the wafer.

In accordance with another additional mode of the invention, there is the step of placing the test circuits in scribe lines of the mask.

In accordance with a concomitant mode of the invention, there is the step of distributing the test circuits in the scribe lines entirely over the wafer surface.

Other features which are considered as characteristic for the invention are set forth in the appended claims.

Although the invention is illustrated and described herein as embodied in a method for examining structures on a wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
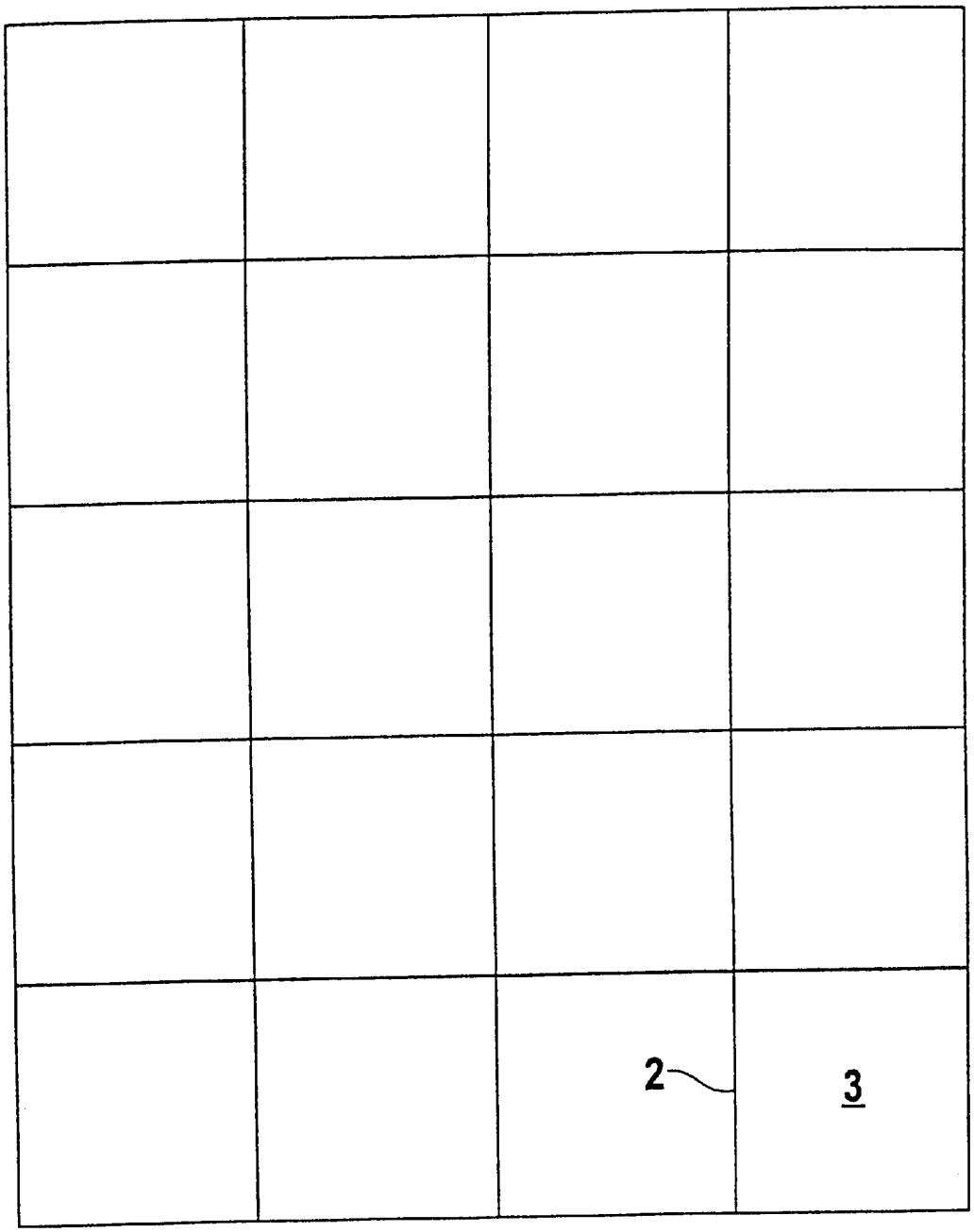
FIG. 1 is a plan view of scribe lines on a surface of a wafer in which scribe lines test circuits are to be disposed according to the invention.

In all the figures of the drawing, sub-features and integral parts that correspond to one another bear the same reference symbol in each case. Referring now to the figures of the drawing in detail and first, particularly, to FIG. 1 thereof, there is shown diagrammatically a detail of a wafer surface 1 of a wafer, in particular a silicon wafer. The wafer is used for fabricating chips with integrated circuits.

A chessboard-like configuration of scribe lines 2 is provided on the wafer surface 1, and subdivides the wafer surface 1 into a multiplicity of segments, which form useful areas 3 and which preferably correspond to the individual chip areas.

Situated in the segments 3 are the structures of the integrated circuits, such as, for example, configurations of transistors and memory cell configurations.

Various configurations for checking the structures on the wafer are provided in the scribe lines 2, which are rejected materials after the conclusion of the production processes to be carried out on the wafer.

In particular, photolithography processes are also used for fabricating the structures on the wafer.

In order to carry out a photolithography process of this type, a photosensitive resist layer is applied to the wafer. A mask is fabricated from the resist layer by predetermined points on the resist layer being exposed by an exposure system, as a result of which the points are chemically altered.

Using a developer, either only the exposed or only the unexposed points on the resist layer are removed, the respective mask thereby being obtained.

During the fabrication of such masks, it is possible, in particular, for overlay errors and registration errors to occur, in other words displacements between different planes in the mask applied on the wafer occur or the mask itself is not aligned exactly relative to the wafer. Furthermore, production and process-dictated location-dependent fluctuations of the structures on the wafer can occur. Fluctuations of this type are obtained by fluctuations of the imaging carried out by the exposure system. Moreover, fluctuations of this type can be caused by inhomogeneities in the mask or by irregularities of the production processes carried out on the mask, such as etching or sputtering processes, for example.

Figure 2:
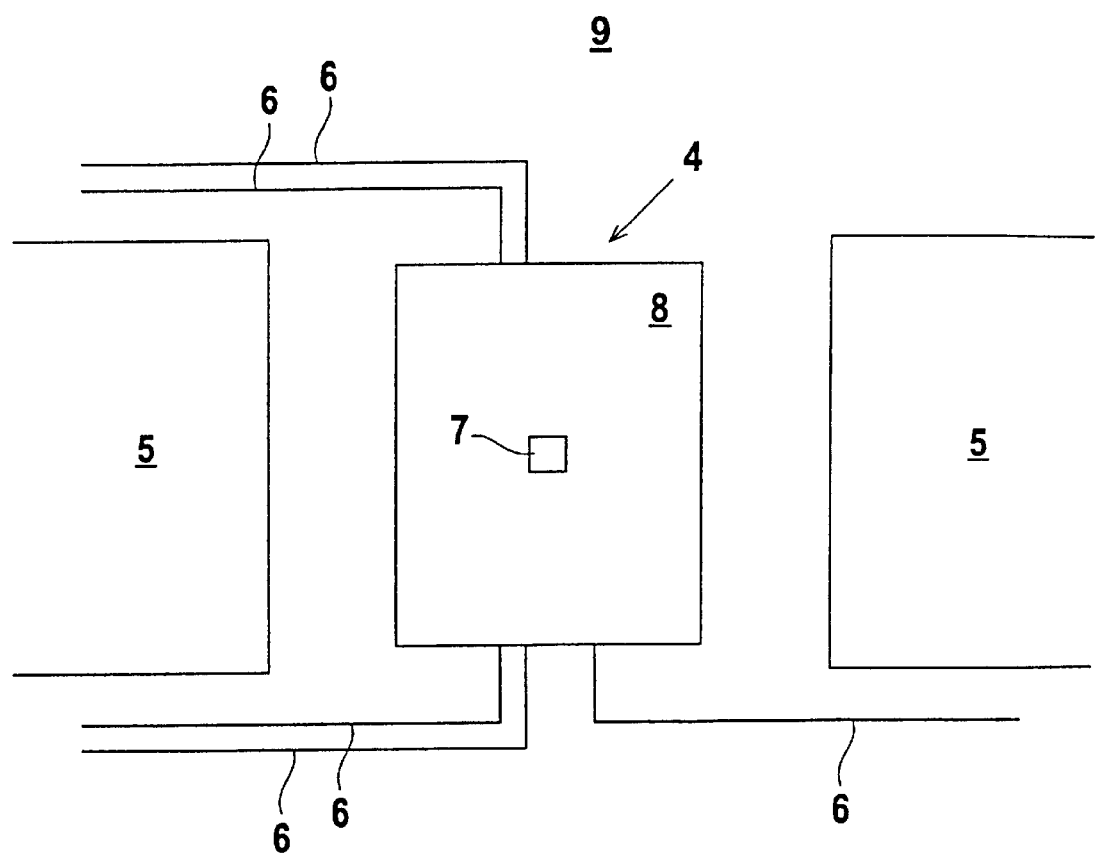
FIG. 2 is an illustration of an exemplary embodiment of a test circuit disposed in the scribe line in accordance with FIG. 1.

According to the invention, both for the purpose of detecting overlay and registration errors and for the purpose of detecting location-dependent fluctuations, test circuits 4 with predetermined test structures are provided in predetermined reference positions in the scribe lines 2 of the wafer (FIG. 2).

In order to determine the errors that occur, the electrical parameters of the test circuits 4 are evaluated in a location-dependent manner. The test circuits 4 in the scribe lines 2 are distributed as uniformly as possible over the entire wafer surface. In this case, the test circuits 4 in the respective reference positions are configured identically.

The test circuits 4 are formed on the mask 9 to be examined, in which case, in particular, the exposure system, which is used for exposing the mask 9 is also used for fabricating the test circuits 4.

FIG. 2 diagrammatically shows an exemplary embodiment of the test circuit 4 configured in the scribe line 2. In the present example, the test circuit 4 is disposed between two test pads 5. A plurality of interconnects 6 are provided for electrically connecting the test circuit 4.

The test circuit 4 has one or a plurality of test transistors 7 that are embedded in a transistor array 8. The transistor array 8 forms a defined reference environment for the test transistors 7, which are preferably disposed in the center of the transistor array 8.

The test transistors 7, just like the transistors of the transistor array 8, have defined gate oxide regions, source/drain regions and also deep trench regions. These regions of the test transistors 7 form the test structures whose formations are detected by measurements of the electrical parameters of the test transistors 7. In order to obtain the most detailed statement possible about, in particular, optical imaging errors of the exposure system, the test structures of the test transistors 7 are configured as minimal structures.

Therefore the dimensions of the test structures have minimal structure sizes with regard to the corresponding circuit structures of the transistors 7 of the transistor array 8 and preferably also of the corresponding structures on the useful area 3 of the wafer.

As a result, the test structures have the maximum sensitivity with regard to the errors that occur, in particular the exposure system imaging errors that occur.

The electrical parameters determined during the test measurements on the test transistors 7 vary in accordance with the fluctuations of the test structures. Consequently, a location-dependent determination of the parameters yields is comprehensive information about the errors of the individual production and process parameters, which errors vary, if appropriate, over the wafer surface 1.

One example of a parameter of this type is the threshold voltage of the test transistor 7.

The threshold voltage is extremely sensitive to line width fluctuations during the performance of the exposure processes for fabricating the gate oxide regions. In particular, the active gate oxide lengths of the test transistors 7 are extremely sensitive to such line width fluctuations, the fluctuations of the gate oxide lengths greatly affecting the threshold voltages. Such line width fluctuations can be caused, in particular, by spatially varying imaging properties of the exposure system. Accordingly, a corresponding spatial variation of the threshold voltages is obtained during the location-dependent determination of the test transistors 7 distributed over the wafer.

Furthermore, the threshold voltages of the test transistors 7 are dependent on possible displacements of the source/drain regions relative to the gate oxide regions and/or of the deep trench regions. Consequently, the deviations of the measured threshold voltages from predetermined desired values and also the spatial fluctuations thereof provide information about the occurring line width fluctuations and displacements of individual test structures in the test transistors 7.

A corresponding evaluation of further electrical parameters of the test transistors 7 makes it possible to accurately determine the individual errors during the imaging of the exposure system, the errors on account of inhomogeneities in the mask and also during the production processes carried out on the mask.

Evaluation of the location-dependent measurement results makes it possible to make statements about the qualities of the structures on the useful area 3 of the wafer, in particular information about the spatial profile of the electrical parameters of the structures being obtained.

In particular, correction values for the parameters of the structures on the wafer can be derived from the measurement results on the test transistors 7. By way of example, the correction values may form a measure of the variation of the parameters of the structures on the wafer. Using the correction values, the structures to be fabricated, such as transistors for example, can then be configured in such a way that they are insensitive to the variations determined on the test measurements.

We claim:

1. A method for examining structures on a wafer, comprising:

applying at least one mask on the wafer and the mask being fabricated by exposure processes and is used for fabricating the structures;

forming test circuits on the mask in predetermined reference positions, forming the test circuits with test transistors having test structures including gate oxide regions, source/drain regions and deep trench regions; and detecting and evaluating in a location-dependent manner electrical parameters of the test circuits for evaluating the structures and the exposure processes.

2. The method according to claim 1, which comprises forming the test circuits with transistor arrays and embedding the test transistors in the transistor arrays.

3. The method according to claim 2, which comprises providing the test structures of the test transistors with minimal structure sizes with regard to the transistor arrays.

4. The method according to claim 3, which comprises providing the test structures of the test transistors with minimal structure sizes with regard to the structures to be examined.

5. The method according to claim 1, which comprises detecting variations in lengths of the gate oxide regions by measuring the electrical parameters of the test transistors, the variations being caused by line width fluctuations in the exposure processes.

6. The method according to claim 1, which comprises detecting an offset of the source/drain regions with respect to the gate oxide regions and the deep trench regions by measuring the electrical parameters of the test transistors.

7. The method according to claim 5, which comprises evaluating threshold voltages of the test transistors as the electrical parameters.

8. The method according to claim 1, which comprises determining location-dependent fluctuations of electrical parameters of the structures to be examined by measuring the electrical parameters of the test circuits.

9. The method according to claim 8, which comprises deriving correction values from the location-dependent fluctuations of the electrical parameters of the structures.

10. The method according to claim 9, which comprises using the correction values for dimensioning the electrical parameters of the structures on the wafer.

11. The method according to claim 1, which comprises placing the test circuits in scribe lines of the mask.

12. The method according to claim 11, which comprises distributing the test circuits in the scribe lines entirely over the wafer surface.

* * * * *